United States Patent [19]

Yamawaki et al.

[11] Patent Number: 5,037,774
[45] Date of Patent: Aug. 6, 1991

[54] PROCESS FOR THE PRODUCTION OF SEMICONDUCTOR DEVICES UTILIZING MULTI-STEP DEPOSITION AND RECRYSTALLIZATION OF AMORPHOUS SILICON

[75] Inventors: Hideki Yamawaki, Isehara; Yoshihiro Arimoto; Shigeo Kodama, both of Tokyo; Takafumi Kimura, Hiratsuka; Masaru Ihara, Chigasaki, all of Japan

[73] Assignee: Fujitsu Limited, Kawasaki, Japan

[21] Appl. No.: 73,839

[22] Filed: Jul. 15, 1987

Related U.S. Application Data

[63] Continuation of Ser. No. 717,119, Mar. 28, 1985, abandoned.

[30] Foreign Application Priority Data

Mar. 28, 1984 [JP]  Japan ................................. 59-60403

[51] Int. Cl.$^5$ ................. H01L 21/20; H01L 21/324; H01L 21/84
[52] U.S. Cl. ............................... 437/82; 148/DIG. 17; 148/DIG. 25; 148/DIG. 150; 156/603; 156/612; 156/613; 156/614; 437/84; 437/85; 437/90; 437/101; 437/108; 437/112; 437/243; 437/247
[58] Field of Search ..................... 437/82, 84, 85, 90, 437/101, 108, 112, 243, 247; 148/DIG. 17, DIG. 25, DIG. 150; 156/603, 612, 613, 614

[56] References Cited

U.S. PATENT DOCUMENTS

| | | | |
|---|---|---|---|
| 3,655,439 | 4/1972 | Seiter | 148/175 X |
| 3,862,859 | 1/1975 | Ettenberg et al. | 148/175 X |
| 4,147,584 | 4/1979 | Garrison et al. | 156/614 X |
| 4,279,688 | 7/1981 | Abrahams et al. | 156/DIG. 64 |
| 4,381,201 | 4/1983 | Sakurai | 148/DIG. 123 |
| 4,448,632 | 5/1984 | Akasaka | 29/576 T |

OTHER PUBLICATIONS

Hokari et al. "Characteristics - - - Si/MgO.Al$_2$Ohd 3/SiO$_2$/Si - - - ".
Fan et al., "Crystallization of Amorphous Silicon-Laser Heating" Applied Physics Letters, vol. 27, No. 4, Aug. 15, 1975, pp. 224–226.

*Primary Examiner*—William G. Saba
*Attorney, Agent, or Firm*—Staas & Halsey

[57] ABSTRACT

Process for the production of semiconductor devices by using silicon-on-insulator (SOI) techniques. The Si layers of the SOI structure include an interfacial layer of Si and a buffer layer of Si formed thereon, whereby the formation of stacking faults in the Si layers can be effectively prevented. Pretreatment of the underlying insulating material with a molybdate solution and interposition of an additional layer of slowly grown single-crystalline Si between the buffer layer of Si and the overlying active Si layer are also effective to inhibit the stacking faults. Semiconductor devices with high quality can be produced with good yield.

15 Claims, 12 Drawing Sheets

BEST AVAILABLE COPY

BEST AVAILABLE COPY
Fig. 7a
Fig. 7b
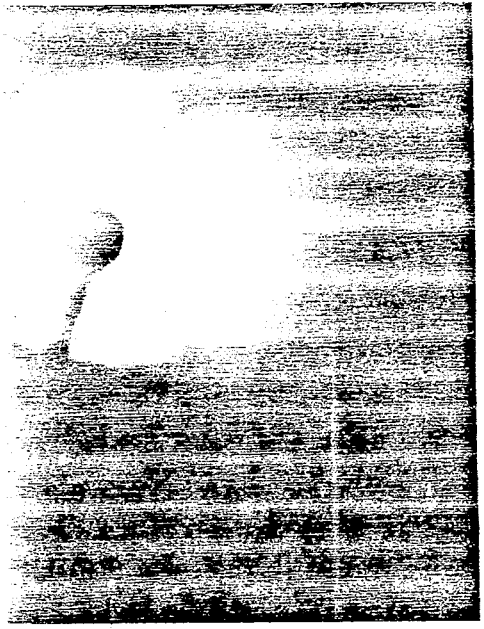

BEST AVAILABLE COPY

BEST AVAILABLE COPY

BEST AVAILABLE COPY

Fig. 10a    Fig. 10b

BEST AVAILABLE COPY

PROCESS FOR THE PRODUCTION OF SEMICONDUCTOR DEVICES UTILIZING MULTI-STEP DEPOSITION AND RECRYSTALLIZATION OF AMORPHOUS SILICON

This is a continuation of co-pending application Ser. No. 717,119 filed on Mar. 28, 1985, now abandoned.

BACKGROUND OF THE INVENTION

Field of the Invention

This invention relates to a process for the production of semiconductor devices. In particular, this invention relates to a process for the production of semiconductor devices which comprise a single-crystalline layer of silicon, as an active layer, on a single-crystalline layer of insulating materials such as magnesia spinel ($MgO \cdot Al_2O_3$) and sapphire ($\alpha\text{-}Al_2O_3$). Such an active silicon layer on an insulator or insulating layer is generally referred to in the art as an SOI (silicon-on-insulator), and is used for fabrication of bipolar transistors, metal-oxide semiconductor (MOS) devices, high-voltage bipolar integrated circuits (IC's), or similar circuits and devices.

Description of the Related Art

Many types of SOI's have been proposed and used in the production of semiconductor devices due to the advantages offered by the same. First, they do not necessitate isolation in the devices or, even if isolation is necessary, it is easy to form an isolation area. Further, semiconductor devices having SOI structures show no or little parasitic capacitance. These remarkable advantages ensure the production of semiconductor devices having a high quality and integrity.

A typical example of the prior art SOI structure can be found in FIGS. 1a and 1b. As illustrated in FIG. 1a, the SOI material comprises a (100) Si substrate 1 having deposited thereon an $SiO_2$ layer 2 and an amorphous Si layer 3. The amorphous Si layer 3 is generally formed by using vapor phase epitaxy (VPE) or other techniques.

In order to convert amorphous Si in the layer 3 to single-crystalline Si, the material is annealed at a temperature of about 600° C. to 1100° C. Crystallization of the amorphous Si is started at an exposed portion of the Si substrate 1, as is shown in FIG. 1b. Namely, the exposed portion of the substrate 1 acts as a seed for crystallization. The single-crystalline Si area 4 gradually extends over the layer 3. Finally, all of the amorphous Si in the layer 3 is converted to a single-crystalline form of silicon.

The result is shown in FIG. 2, which is a schematic plan view of the resulting SOI structure. Unexpectedly, the single-crystalline Si layer 4 has partially formed (110) and (111) crystal structures in addition to the (100) crystal structure. This means that the layer 4 is not a single-crystalline form, but polycrystalline form. Such an undesirable result can be frequently encountered in the formation of the illustrated SOI structure.

Heteroepitaxy is also well-known and widely used in the formation of SOI structures. As we have already reported in, for example, M. Ihara et al., "Vapor phase epitaxial growth of $MgO \cdot Al_2O_3$", J. Electrochem. Soc., Vol. 129, No. 11, pp. 2569-2573, Nov. 1982, and M. Ihara, "Epitaxial spinel growth for integrated circuits", Microelectronic Engineering, Vol. 1, pp. 161-177, 1983, SOI structures produced by using heteroepitaxy or the heteroepitaxial growth technique have many advantages. For example, the resulting active Si layers on sapphire or spinel show high quality and mobility. High voltage isolation can be achieved. The large-sized Si wafers can be used as the substrate, therefore low-price devices can be produced.

However, this technique suffers from a drawback that the active Si layers have unavoidable stacking faults due to their heterojunction with the underlying sapphire or spinel layer. This defect will become clearer with reference to FIG. 3, which illustrates a typical Si-on-spinel ($MgO \cdot Al_2O_3$)-on-Si double heterostructure.

In FIG. 3, the illustrated SOI structure comprises a (100) single-crystalline Si substrate 1 having deposited thereon a (100)-oriented spinel epitaxial layer 5 and (100)-oriented single-crystalline Si layer 6. The Si layer 6 is generally deposited by VPE. During the VPE process, stacking faults (111) are induced in the growing Si layer 6. We found that the formation of the stacking faults is started at limited portions of the Si/spinel interface, each of which acts as a core of the fault formation during crystal growth. Such core portions are considered to be due to the about 0.8% lattice mismatch between Si and spinel.

The stacking faults result in conspicuous straight defects on a surface of the active Si layer after they have passed through the layer. This means lowering of the yield of the SOI structure and, accordingly, the finally produced devices. It is, therefore, desirable to provide improved methods for forming SOI structures which have thin or thick layers of single-crystalline Si with high quality and without stacking faults, on an insulating layer of spinel, sapphire, or other single crystals.

SUMMARY OF THE INVENTION

According to this invention, there is provided a process for the production of semiconductor devices by using SOI techniques, which process comprises the steps of forming a first layer of single-crystalline silicon on an underlying layer of single-crystalline insulating material, forming a second layer of amorphous silicon on the first layer of silicon, and then converting amorphous silicon of the second layer to single-crystalline silicon.

The single-crystalline insulating material used herein can be optionally selected from the group of insulators conventionally used in the art such as sapphire, magnesia spinel, and the like, depending on the type of the desired device. For example, sapphire can be used in the form of a sapphire substrate, and magnesia spinel can be used in the form of a spinel epitaxial layer on the Si substrate. Epitaxial spinel growth on an Si substrate is described in, for example, the M. Ihara references cited above. The crystal orientation of these materials is (100).

The first layer of single-crystalline silicon can be epitaxially grown on the surface of the underlying insulator layer. Epitaxial growth of Si is preferably carried out by using conventional VPE techniques. For example, it may be carried out at a temperature of 900° C. to 1100° C. in a mixed gas of monosilane ($SiH_4$) and hydrogen. The thickness of the first Si layer is preferably in the range of 0.01 to 10 $\mu$m. A layer thickness of more than 10 $\mu$m should be avoided, since it results in increased size of the stacking faults, although the number of the faults is decreased. The first Si layer has a (100)

crystal structure and acts as an interfacial layer between the insulator layer and the active Si layer.

After the formation of the first Si layer, a second layer of single-crystalline silicon, which has a (100) crystal structure and acts as a buffer layer, is formed on the first Si layer. The Si buffer layer can effectively inhibit elongation of the stacking faults caused in the underlying first Si layer within the buffer layer and, if an active Si layer is formed on the buffer layer, extension of the faults to the active Si layer.

As described above, the formation of the second Si layer comprises a series of two steps. First, an amorphous silicon layer is preferably formed on the first Si layer by using conventional VPE techniques at a reaction temperature of 350° C. to 650° C. in an atmosphere of inert gas such as $N_2$, Ar, or He or inert gas-based mixed gas which comprises a major amount of inert gas and a minor amount of other gas such as $H_2$. Monosilane is added to the atmosphere. The formation of the amorphous Si layer in this step can be easily carried out under the above reaction conditions.

In the above first step, hydrogen in the mixed gas is effective to prevent the influence of oxygen gas which is contained as impurities in an inert gas. If the impure inert gas has no hydrogen gas, oxygen gas will form silicon dioxide as a result of the reaction with silicon. The amount of hydrogen gas to be added to the inert gas is not critical, but is preferably less than 30% of the total amount of the mixed gas.

Further, the reaction temperature of 350° C. to 650° C. is essential to ensure the formation of amorphous silicon in the above first step. If the reaction temperature is lower than 350° C., the decomposition of monosilane will not be started. Namely, the following reaction is not substantially induced:

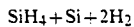

$$SiH_4 + Si + 2H_2$$

On the other hand, if the reaction temperature exceeds 650° C., polycrystalline silicon will be formed between about 650° C. and 850° C., and single-crystalline silicon at about 850° C. or more, respectively.

As a second step, the epitaxially grown amorphous silicon on the first Si layer is annealed at a temperature of 650° C. to 1350° C. in an atmosphere of hydrogen gas with conventional SPE techniques to convert it to single-crystalline silicon. The conversion process is also referred to in this art as a "recrystallization" process. The annealing temperature of 650° C. to 1350° C. is effective to shorten the time of the recrystallization process and to produce the second single-crystalline Si layer having little or no defects.

In the formation of the second Si layer, the layer thickness of the amorphous silicon formed in the first step is preferably within the range of 0.01 to 5 μm. A layer thickness of more than 5 μm should be avoided, since it tends to cause polycrystallization of the amorphous silicon during the second step or the subsequent annealing step for recrystallization.

In an aspect of this invention, the production process further comprises the step of forming a third layer of single-crystalline silicon on the second layer of single-crystalline silicon. The third Si layer is generally recognized in this art to be an active Si layer and has a (100) crystal structure, as in the underlying first and second Si layers. The third Si layer can be formed in conventional manners, such as by VPE techniques, frequently used in the formation of single-crystalline silicon. For example, it may be epitaxially grown on the second Si layer in a mixed gas of $SiH_4$ or $SiCl_4$ and $H_2$ and at a growth temperature of 900° C. to 1100° C. The growth rates of single-crystalline Si or active Si are about 0.2 to 3 μm/min. The layer thickness of the epitaxially grown Si varies depending on the requirements of the finally produced devices.

In another aspect of this invention, a surface of the layer of single-crystalline insulating material is pretreated with a solution of 1 to 0.01 g of molybdic acid in 1 l of 30% hydrogen peroxide water, before the deposition of the first Si layer thereon. As a result of pretreatment of the insulator layer, the density of the defects caused in the first Si layer is remarkably decreased and consequently an SOI structure of a high quality is produced. This is because the introduction of a lot of molybdenum cores in the insulator layer results in more complete formation of the first Si layer, i.e., heteroepitaxially grown Si layer, on the insulator layer.

In another aspect of this invention, two or more of the second single-crystalline silicon layers above may be formed, thereby increasing the quality of the third Si layer which is subsequently formed on a second Si layer. In other words, the steps of forming the second layer of amorphous silicon and converting amorphous silicon in the second layer to single-crystalline silicon may be repeated two or more times.

In still another aspect of this invention, the production process may further comprise the step of forming, before the formation of the third layer of silicon on the second layer of silicon, an additional layer of single-crystalline silicon on the second layer of silicon, the additional layer being formed at a growth rate slower than that of the third layer. The formation of the slowly grown single-crystalline silicon layer is particularly effective to remove contaminants on the second Si layer, which are induced due to exposure to hydrogen gas during the annealing step and are one factor of increasing stacking faults in the third Si layer to be deposited on the second Si layer. Contaminants partially distributed on the second Si layer are oxygen atoms and the like. This removal step can be easily carried out in comparison with the conventional purification step which comprises etching the second Si layer to a depth sufficient to remove the contaminants.

The additional layer of slowly grown silicon can be formed by using conventional VPE techniques as in the formation of the third Si layer described above. In contrast with the growth rates of single-crystalline Si for the third Si layer, which rates, as previously described, are about 0.2 to 3 μm/min, the growth rates of single-crystalline Si for the additional Si layer are generally about 0.01 to 0.2 μm/min. The thickness additional Si layer of about 0.5 to 2 μm is sufficient to substantially remove the contaminants on the second Si layer.

As is apparent from the above description, according to this invention, semiconductor devices which comprise a single-crystalline insulator layer, such as spinel or sapphire, having deposited thereon thin or thick single-crystalline Si layers with high quality and without stacking faults can be produced with high yields.

BRIEF DESCRIPTION OF THE DRAWINGS

FIGS. 10a and 10b are photo-micrographs ($\times 400$) of the molybdate-treated and untreated single-crystalline Si layers according to this invention, respectively;

DESCRIPTION OF THE PREFERRED EMBODIMENTS

This invention will be further described with reference to FIGS. 4a to 18. First, it should be understood that the insulator used in the practice of this invention is not limited to magnesia spinel, though the drawings are explained referring to the spinel insulator.

Figure 1A:
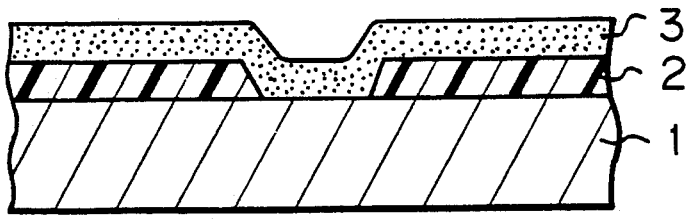
FIGS. 1a and 1b are schematic cross-sectional views showing, in sequence, the production of a prior art SOI structure.
Figure 1B:
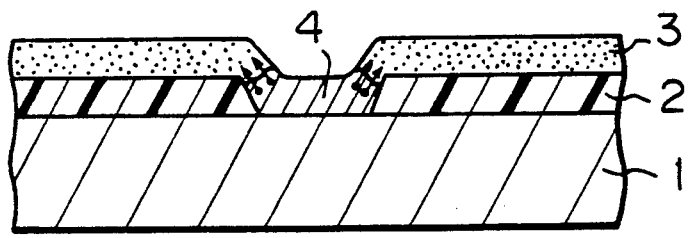
Figure 2:
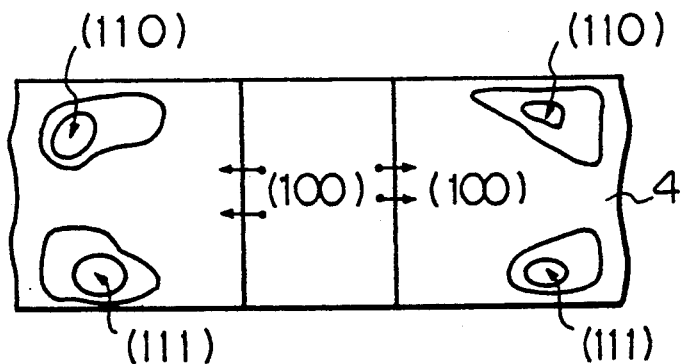
FIG. 2 is a plane view showing the crystal orientation of the active Si layer of the prior art SOI structure according to FIGS. 1a and 1b.
Figure 3:
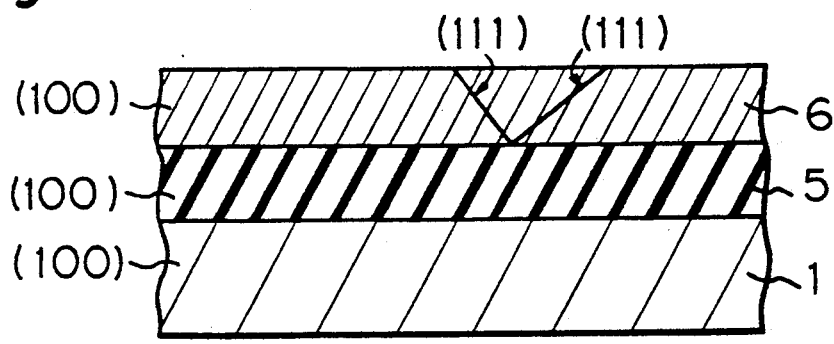
FIG. 3 is a schematic cross-sectional view showing another prior art SOI structure.
Figure 4A:
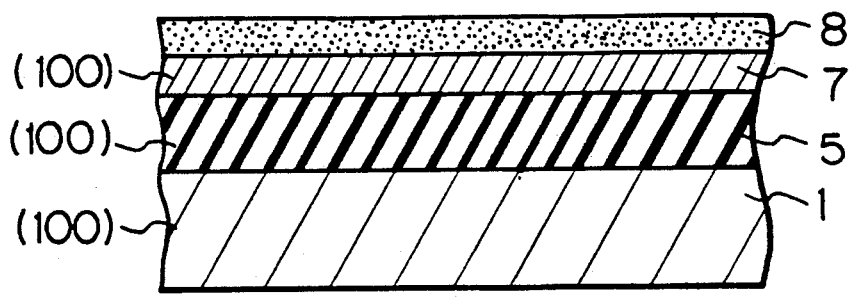
FIGS. 4a and 4b are schematic cross-sectional views showing, in sequence, the production of the SOI structure according to one embodiment of this invention.
Figure 4B:
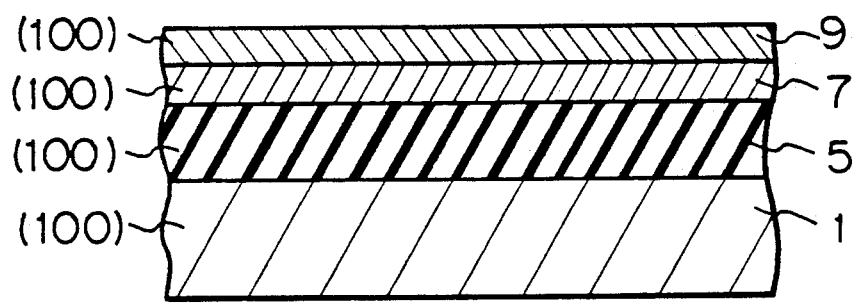

Referring now to FIGS. 4a and 4b, there is illustrated one preferred embodiment of this invention. As is illustrated in FIG. 4a, a single-crystalline spinel layer 5 having a thickness of about 1 $\mu$m is epitaxially single-crystalline Si layer 7 having a thickness of 0.5 $\mu$m is then formed on the spinel layer 5. The formation of the first Si layer 7 is attained with conventional methods, for example, epitaxial growth, at a temperature of 900° C. to 950° C. and in a mixed gas of monosilane and hydrogen. During the epitaxy process, some defects will be induced in the resulting Si layer, since its lower surface is a hetero-interface. In order to obtain the optimum effects of this invention, it is desirable to make the thickness of the first Si layer from 0.01 $\mu$m to 10 $\mu$m.

After the formation of the first Si layer 7, an amorphous Si layer 8 of a thickness of about 0.5 $\mu$m is deposited on the layer 7. The amorphous Si layer 8 can be deposited in a conventional VPE manner under the following conditions: mixed gas of monosilane and nitrogen; reaction temperature of about 540° C.; and growth rates of about 830Å/min. Useful carrier gases other than nitrogen gas are helium or other inert gases. The useful range of the reaction temperature is from 350° C. to 650° C.

Figure 6A:
FIGS. 6a and 6b are photo-micrographs ($\times 400$) of the single-crystalline Si layer showing occurrence and distribution of the faults therein.
Figure 6B:
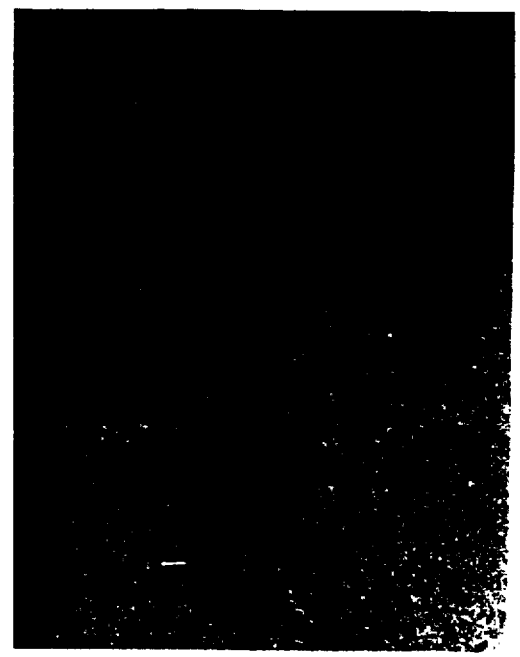

The deposited amorphous Si layer 8 is then annealed in hydrogen gas at about 1100° C. and for about 10 min. Upon annealing, as is shown in FIG. 4b, amorphous silicon in the layer 8 is converted to single-crystalline silicon 9. While the prior annealing process is usually carried out in an atmosphere of helium or other inert gases, the annealing process of this invention is carried out in hydrogen gas. We found that stacking faults in the single-crystalline Si layer to be deposited on the thus converted single-crystalline Si layer 9 are notably decreased if annealing is performed in hydrogen gas. In contrast, annealing in an inert gas results in a lot of stacking faults in the single-crystalline Si layer. These differences of the results are demonstrated in FIG. 6a (prior art; annealing in He) and FIG. 6b (this invention; annealing in $H_2$), both of which are photomicrographs ($\times 400$) of the single-crystalline Si layer showing occurrence and distribution of the faults therein. FIG. 6a shows many faults, while FIG. 6b shows decreased faults.

Figure 7A:
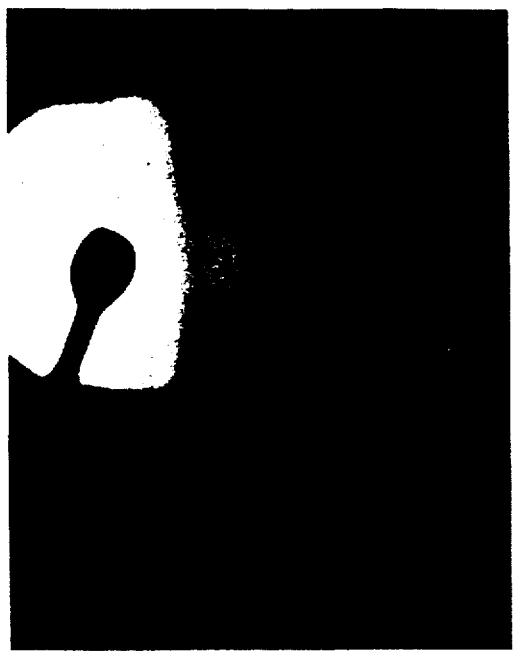
FIGS. 7a and 7b are reflection electron diffraction patterns ($\times 400$) of the Si layer before and after annealing, respectively.
Figure 7B:
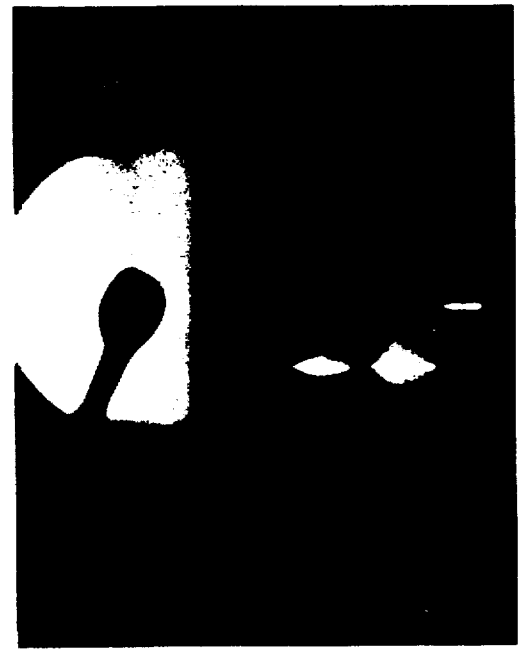
Figure 8A:
Figure 8B:

FIGS. 7a and 7b show reflection electron diffraction patterns ($\times 400$) of the Si layer before and after annealing or recrystallization, respectively. FIG. 7a (Photomicrograph for unannealed Si layer 8 in FIG. 4a) shows neither spots nor rings. This demonstrates that the unannealed Si layer 8 is an amorphous form. FIG. 7b, which is a photomicropraph for annealed Si layer 9 in FIG. 4b, shows some spot-like luminance. From these luminances, it is ascertained that Si in the layer 9 is in a single-crystalline form. As previously described, the annealing conditions effective to attain the remarkable effects of this invention are an atmosphere of hydrogen gas and temperature range of 650° C. to 1350° C.

Figures 8A, 8B:
FIGS. 8a and 8b are SEM photographs ($\times 20,000$) of the single-crystalline Si layers with and without an annealed Si layer, respectively.
Figure 11:
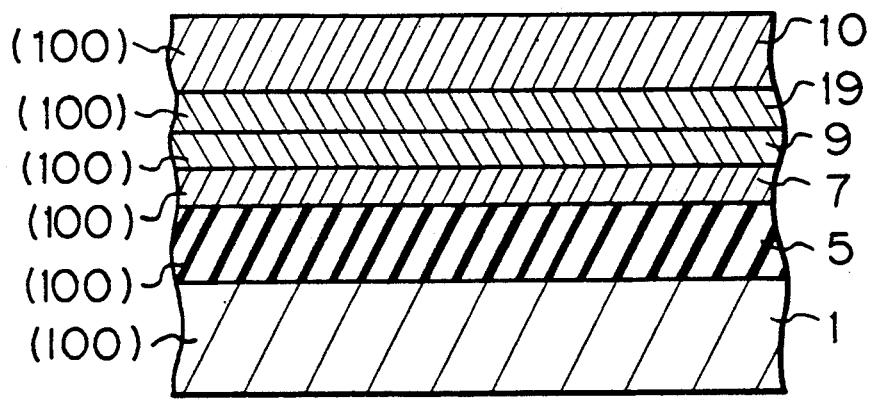
FIG. 11 is a schematic cross-sectional view of the SOI structure according to another embodiment of this invention.
Figure 14:
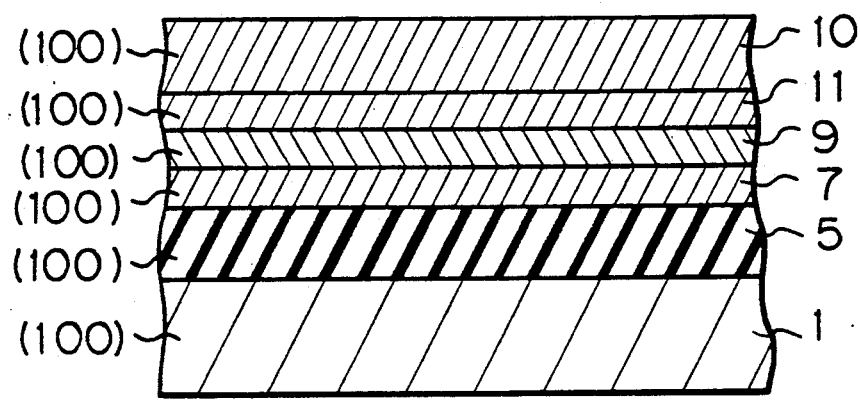
FIG. 14 is a schematic cross-sectional view showing the SOI structure according to still another embodiment of this invention.

Further, FIGS. 8a and 8b are SEM photographs ($\times 20,000$) of the single-crystalline Si layers of FIG. 4b with and without the layer 9, respectively. FIG. 8a shows the occurrence and distribution of the faults in the annealed Si layer or single-crystalline layer 9. From this photograph, it can be evaluated that the density of faults is on the order of $5 \times 10^4$ to $5 \times 10^5$ cm$^{-2}$. In contrast, FIG. 8b (prior art) has conspicuous faults of a density on the order of $10^8$ to $10^9$ cm$^{-2}$. FIG. 8b is an SEM photograph of the 1.0 $\mu$m thick single-crystalline Si layer 7 of FIG. 4b having no layer 9. It is apparent from FIGS. 8a and 8b that stacking faults in the single-crystalline Si layers are remarkably decreased, if the second amorphous Si layer 8 is first formed on the first single-crystalline Si layer 7 and is then recrystallized to the second single-crystalline Si layer 9 according to this invention 4a and 4b).

Figure 5:
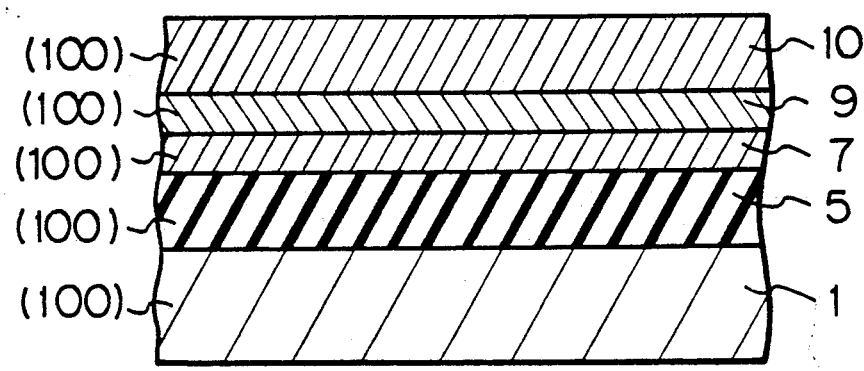
FIG. 5 is a schematic cross-sectional view showing the SOI structure according to another embodiment of this invention.

FIG. 5 shows another preferred embodiment of this invention. As is shown in this figure, upon formation of the single-crystalline Si layer 9, a third single-crystalline Si layer 10 may be formed on the Si layer 9. The Si layer 10 can be VPE-grown in hydrogen gas at about 950° C. and at a growth rate of 0.85 $\mu$m/min. The thickness of the epitaxially grown Si layer 10 is about 40 $\mu$m. The occurrence and distribution of the faults in the third Si layer 10 are shown in the accompanying drawing, FIG. 9a, which is a photomicrograph taken at 400 magnifications. From this photograph, the fault density of the layer 10 is evaluated to be on the order of $10^4$ to $10^5$ $cm^{-2}$. For comparison purposes, we took a photomicrograph ($\times 400$) of the single-crystalline Si layer directly grown on the magnesia spinel (prior art SOI structure). The photograph of FIG. 9b shows that the prior art Si layer has many faults and its fault density is on the order of $10^5$ to $10^6$ $cm^{-2}$. From these photographs, it is clear that this invention can notably improve the fault density of the Si layers on the spinel.

According to another preferred embodiment of this invention, in order to further decrease the fault density, thereby producing a single-crystalline Si layer with excellent quality, it is proposed to previously treat a surface of the magnesia spinel layer with a solution of molybdate. Molybdate pretreatment of the spinel layer can be carried out, for example, as follow.

As in the production process which was described with reference to FIGS. 4a, 4b, and 5, a 1 $\mu$m thick single-crystalline spinel layer is epitaxially grown on the single-crystalline Si substrate. The Si substrate with the grown spinel layer is then dipped in a solution of about 0.1 g of molybdic acid in 1 l of about 30% hydrogen peroxide/water for about 30 seconds. After drying, as in the previously described production process, a 0.5 $\mu$m thick first single-crystalline Si layer is epitaxially grown on the dried spinel layer by using a VPE technique under the following conditions: atmosphere of mixed gas of monosilane and hydrogen; reaction temperature of about 950° C.; and growth rate of about 0.85 $\mu$m/min. Then, a 0.5 $\mu$m thick amorphous Si layer is epitaxially grown on the first single-crystalline Si layer by using a VPE technique. The epitaxial growth can be carried out in a mixed gas of monosilane and nitrogen at a reaction temperature of about 540° C. and at a growth rate of about 830 Å/min. The epitaxially grown amorphous Si layer is then annealed in hydrogen gas at about 1100° C. for about 10 minutes to convert it to the second single-crystalline Si layer.

After the conversion process is completed, a third single-crystalline Si layer is epitaxially grown on the second single-crystalline Si layer. The formation of the third Si layer can be formed by using a VPE technique under the following conditions: atmosphere of mixed gas of monosilane and hydrogen; reaction temperature of about 950° C.; and growth rate of about 0.85 $\mu$m/min. The thickness of the third Si layer is about 40 $\mu$m.

Figures 10A, 10B:
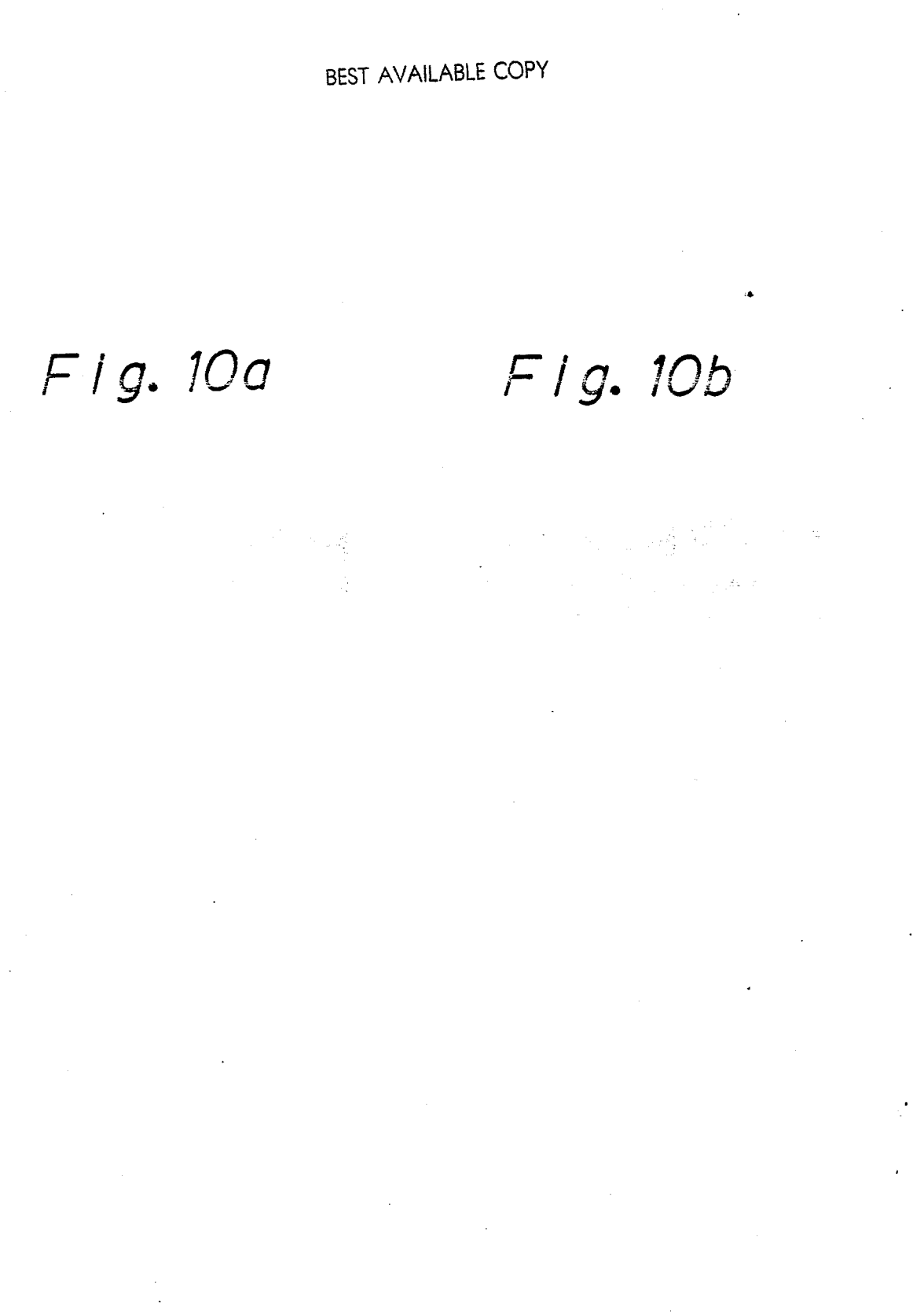

The thus produced SOI structure has only few stacking faults. FIG. 10a is a photomicrograph ($\times 400$) of the third Si layer of the SOI structure, from which photograph the fault density is evaluated to be on the order of $10^3$ to $10^4$ $cm^{-2}$. In contrast to this, the fault density of the third Si layer produced as in FIGS. 4a, 4b, and 5 is determined to be on the order of $10^4$ to $10^5$ $cm^{-2}$ from FIG. 10b, which is a photomicrograph ($\times 400$) of the third Si layer.

According to still another preferred embodiment of this invention, it is proposed to interpose two or more Si buffer layers or second single-crystalline Si layers between the first and third single-crystalline Si layers. Unexpectedly, we found that the formation of multiple Si buffer layers is effective to further decrease the fault density of the third Si layer produced in the above-described embodiment of this invention, namely, the order of $10^3$ to $10^4$ $cm^{-2}$. The production process of this embodiment will be described hereinafter with reference to FIGS. 11 and 12.

As in the last described production process, which includes pretreatment of the spinel layer with molybdate a 1 $\mu$m thick single-crystalline spinel layer 5 is formed on the single-crystalline Si substrate 1. The Si substrate 1 with the spinel layer 5 is dipped in a solution of about 0.1 g of molybdic acid in 1 l of about 30% hydrogen peroxide/water for about 30 seconds and then dried. After drying, a 0.5 $\mu$m thick first single-crystalline Si layer 7 is epitaxially grown on the spinel layer 5 in a mixed gas of monosilane and hydrogen at a temperature of about 950° C. and at a growth rate of about 0.85 $\mu$m/min. Thereafter, a 0.5 $\mu$m thick amorphous Si layer (not shown) is epitaxially grown on the first Si layer 7 in a mixed gas of monosilane and nitrogen at a temperature of about 540° C. and at a growth rate of about 830 Å/min The amorphous Si layer is then annealed in hydrogen gas at about 1100° C. for about 10 minutes. As a result of conversion of amorphous silicon to single-crystalline silicon, a second single-crystalline Si layer (first Si buffer layer) 9 is obtained. Further, the above-described series of the steps of forming the amorphous Si layer and converting amorphous silicon in the layer to single-crystalline silicon is repeated to obtain an additional second single-crystalline Si layer (second Si buffer layer) 19. Finally, a third single-crystalline Si layer 10 is epitaxially grown on the second Si buffer layer 19 in a mixed gas of monosilane and hydrogen at a temperature of about 950° C. and at a growth rate of about 0.85 $\mu$m/min. The thickness of the deposited third Si layer 10 is about 40 $\mu$m.

The thus produced SOI structure shows significantly decreased fault density. Its fault density is on the order of $10^2$ to $10^3$ $cm^{-2}$ and is evaluated from FIG. 13a, namely, the photomicrograph (400 $\times$) of the third Si layer of the SOI structure. For comparison purposes, another photomicrograph ($\times 100$) of the third Si layer of the SOI structure which is identical with that of FIG. 11, except for the omission of the second Si buffer layer 19, is shown in FIG. 13b. The fault density of the third Si layer of the latter SOI structure, as described above, is on the order of $10^3$ to $10^4$ $cm^{-2}$.2

Figure 12:
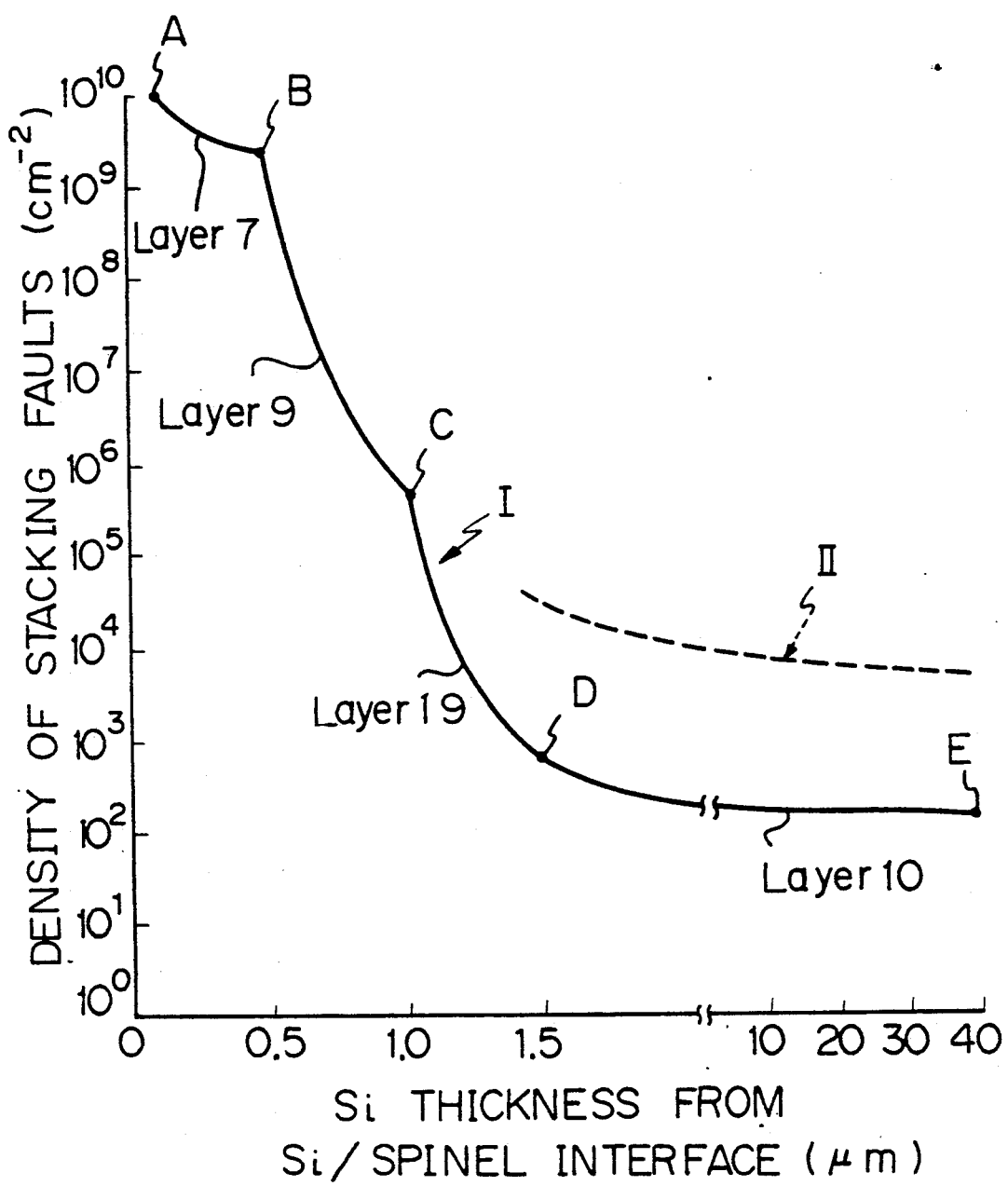
FIG. 12 is a graph of fault density as a function of Si thickness from the Si/spinel interface.

Effects of the duplicated Si buffer layers 9 and 19 will be further clarified with reference to FIG. 12, which is a graph showing a density of stacking faults as a function of Si thickness from the interface between the spinel layer 5 and the first Si layer 7. The solid line I and dotted line II correspond to FIGS. 13a and 13b, respectively, and points A, B, C, and D each indicates an interface between two adjacent layers. In contrast to the single Si buffer layer (Line II), the duplicated Si buffer layers (Layers 9 plus 19) (Line I) indicate sharply decreased fault density.

In another preferred embodiment of this invention, it is also proposed to interpose an additional slowly grown single-crystalline Si layer between the second Si buffer layer and the third Si layer. This process is effective to further decrease the fault density of the third Si layer of the molybdate-pretreated spinel layer-containing SOI structure described above, namely, the order of $10^3$ to $10^4$ $cm^{-2}$. Details of this process will be described hereinbelow with reference to FIG. 14.

As in the previously described production of the molybdate-pretreated spinel layer-containing SOI structure, a 1 $\mu$m thick single-crystalline spinel layer 5 is formed on a single-crystalline Si substrate 1. The Si substrate 1 with the spinel layer 5 is dipped in a solution of about 0.1 g of molybdic acid in 1 l of about 30% hydrogen peroxide/water for about 30 seconds and then dried. After drying, a 0.5 μm thick first single-crystalline Si layer 7 is epitaxially grown on the spinel layer 5 in a mixed gas of monosilane and hydrogen at a temperature of about 950° C. and at a growth rate of about 0.85 μm/min. Thereafter, a 0.5 μm thick amorphous Si layer (not shown) is epitaxially grown on the first Si layer 7 in a mixed gas of monosilane and nitrogen at a temperature of about 540° C. and at a growth rate of about 830 Å/min. The amorphous Si layer is then annealed in hydrogen gas at about 1100° C. for about 10 minutes. As a result of conversion of amorphous silicon to single-crystalline silicon, a second single-crystalline Si layer 9 is obtained.

Then, an additional 2 μm thick single-crystalline Si layer 11 is epitaxially grown on the second Si layer 9 in a mixed gas of monosilane and hydrogen at about 950° C. and at a slow growth rate of about 0.1 μm/min. As a result, impurities, for example, oxygen atoms, which partially occur on the surface of the second Si layer 9 and adversely affect the quality of the epitaxially grown Si crystal on the layer 9 are removed. Finally, a third single-crystalline Si layer 10 is epitaxially grown on the additional Si layer 11 in a mixed gas of monosilane and hydrogen at a temperature of about 950° C. and at a growth rate of about 0.85 μm/min. The thickness of the deposited third Si layer 10 is about 40 μm.

The thus produced SOI structure shows significantly decreased fault density. Its fault density is on the $10^2$ to $10^3$ cm$^{-2}$ and is evaluated from FIG. 15a, namely, the photomicrograph (x 400) of the third Si layer of the SOI structure. For comparison purposes, another photomicrograph ($\times 100$) of the third Si layer of the SOI structure, which is identical with that of FIG. 14 except for omission of the additional Si layer 11, is shown in FIG. 15b. The fault density of the third Si layer of the latter SOI structure, as described above, is on the order of $10^3$ to $10^4$ cm$^{-2}$.

In the production process described above, the additional Si layer 11 is epitaxially grown in a mixed gas of monosilane and hydrogen. However, in addition to this mixed gas, it is also possible to use a mixed gas of hydrogen and silicon tetrachloride or dichlorosilane or a mixed gas of said mixed gas and hydrogen chloride. The growth temperature and growth rate are preferably 950° C. to 1150° C. and 0.01 to 0.2 μm/min, respectively.

Further, as previously described, the formation of the third Si layer 10 can be preferably carried out in a mixed gas of monosilane and hydrogen. Similarly, other gases conventionally used in this field, for example, silicon tetrachloride and dichlorosilane, may be used to obtain satisfactory results.

Figure 16:
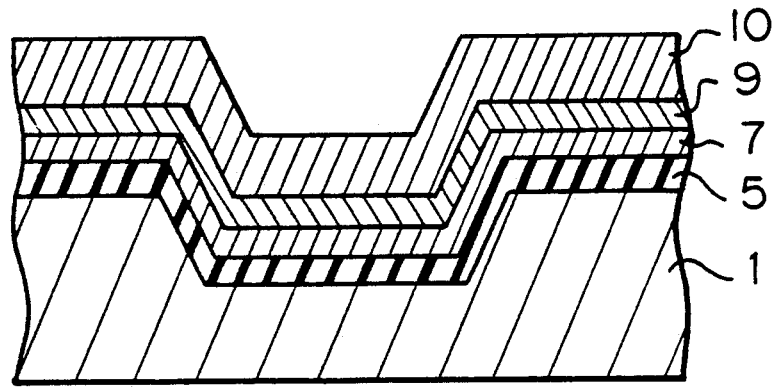
FIGS. 16, 17, and 18 are each a schematic cross-sectional view of the SOI structure with a well-etched Si substrate according to preferred embodiments of this invention.
Figure 17:
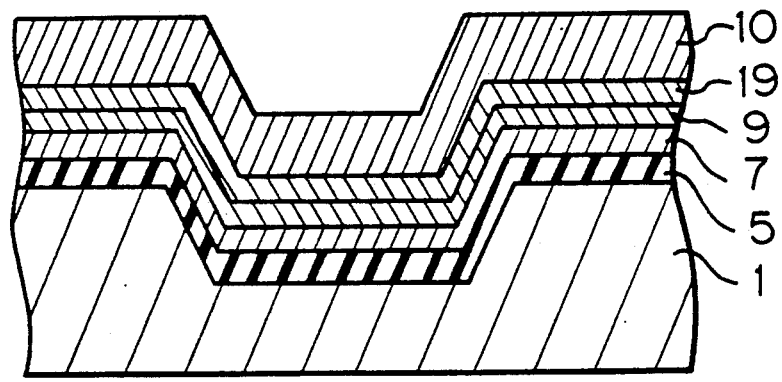
Figure 18:
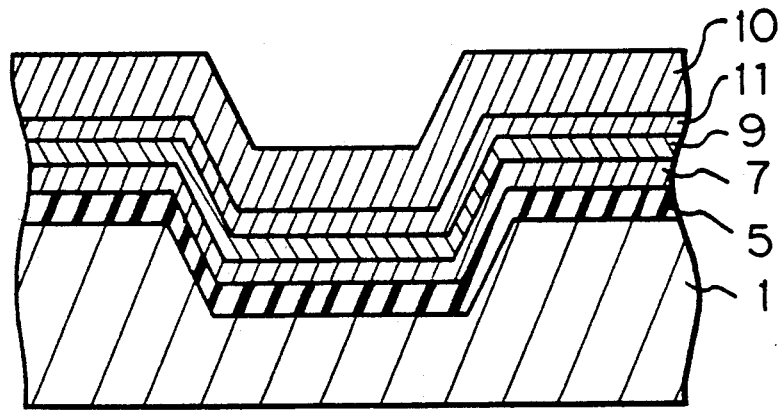

Furthermore, it was found from experiments that the epitaxial growth of amorphous silicon can be preferably carried out at a growth temperature of 350° C. to 650° C. and at a growth rate of 20 to 2000 Å/min FIGS. 16, 17, and 18 are schematic cross-sectional views showing the SOI structures with well-etched Si substrates according to this invention. Since FIGS. 16, 17, and 18 correspond to FIGS. 5, 11, and 14, we will omit detailed descriptions of these drawings.

We claim:

1. A process for the production of semiconductor devices by using silicon-on-insulator techniques, comprising the steps of:

a) forming a layer of single-crystalline insulating material on a silicon substrate;
b) forming, by vapor phase epitaxy, a first layer of single-crystalline silicon on the layer of single-crystalline insulating material;
c) forming a second layer of amorphous silicon on the first layer of single-crystalline silicon; and
d) converting the amorphous silicon of the second layer to single-crystalline silicon.

2. A production process as in claim 1, in which:
the first layer of single-crystalline silicon is formed at a layer thickness of 0.01 to 10 μm and
the second layer of amorphous silicon is formed at a layer thickness of 0.01 to 5 μm.

3. A production process as in claim 1, in which the second layer of amorphous silicon is formed by using a vapor phase epitaxy technique at a reaction temperature of 350° C. to 650° C. in an atmosphere of inert gas or inert gas-based mixed gas, and amorphous silicon of the second layer is then converted to single-crystalline silicon by using a solid phase epitaxy technique at an annealing temperature of 650° C. to 1350° C. in an atmosphere of hydrogen gas.

4. A production process as in claim 1, in which a surface of the layer of single-crystalline insulating material is treated with a solution of 1 to 0.001 g of molybdic acid in 1 l of 30% hydrogen peroxide water, before the formation of the first layer of silicon thereon.

5. A production process as in claim 1, in which the steps of forming the second layer of amorphous silicon and converting amorphous silicon in the second layer to single-crystalline silicon are repeated two or more times.

6. A process for the production of semiconductor devices by using silicon-on-insulator techniques, comprising the steps of:

a) forming a layer of single-crystalline insulating material on a silicon substrate;
b) forming, by vapor phase epitaxy, a first layer of single-crystalline silicon on the layer of single-crystalline insulating material;
c) forming a second layer of amorphous silicon on the first layer of single-crystalline silicon;
d) converting the amorphous silicon of the second layer to single-crystalline silicon; and
e) forming a third layer of single-crystalline silicon on the second layer of single-crystalline silicon.

7. A production process as in claim 6, in which:
the first layer of single-crystalline silicon is formed having a thickness of 0.01 to 10 μm; and
the second layer of amorphous silicon is formed having a thickness of 0.01 to 5 μm.

8. A production process as in claim 6, in which the second layer of amorphous silicon is formed by using a vapor phase epitaxy technique at a reaction temperature of 350° C. to 650° C. in an atmosphere of inert gas or inert gas-based mixed gas, and amorphous silicon of the second layer is then converted to single-crystalline silicon by using a solid phase epitaxy technique at an annealing temperature of 650° C. to 1350° C. in an atmosphere of hydrogen gas.

9. A production process as in claim 6, in which a surface of the layer of single-crystalline insulating material is treated with a solution of 1 to 0.001 g of molybdic acid in 1 l of 30% hydrogen peroxide water, before the formation of the first layer of silicon thereon.

10. A production process as in claim 6, in which the steps of forming the second layer of amorphous silicon and converting amorphous silicon in the second layer to single-crystalline silicon are repeated two or more times.

11. A production process as in claim 6, which further comprises the step of forming, before the formation of the third layer of silicon on the second layer of silicon, an additional layer of single-crystalline silicon on the second layer of silicon, the additional layer being formed at a growth rate slower than that of the third layer.

12. A production process as in claim 11, wherein said growth rate of said additional layer is about 0.01 to 0.2 μm/min.

13. A production process as in claim 11, wherein the thickness of said additional layer is about 0.5 to 2 μm.

14. A production process as in claim 6, each of said insulating material, first, second and third layers being a (100) surface of the respective single crystal.

15. A production process as in claim 1, each of said insulating material, first and second layers being a (100) surface of the respective single crystal.

* * * * *

UNITED STATES PATENT AND TRADEMARK OFFICE
CERTIFICATE OF CORRECTION

PATENT NO. : 5,037,774
DATED : AUGUST 6, 1991
INVENTOR(S) : HIDEKI YAMAWAKI ET AL.

It is certified that error appears in the above-identified patent and that said Letters Patent is hereby corrected as shown below:

TITLE PAGE, Col. 2, [56] References Cited, after line 4, insert the following which were inadvertently omitted by the Patent Office:

--4,046,618   9/1977   Chaudhari et al. ....... 156/603
  4,177,321  12/1979   Nishizawa ............. 437/84--.

[56] References Cited, at the end of this section, after line 8, ending with the inventor, Akasaka, insert the following which was inadvertently omitted by the Patent Office:

--FOREIGN PATENT DOCUMENTS 0051249   5/1982   Europe.--;

[56] OTHER PUBLICATIONS delete lines 1 and 2 and insert the following in which certain portions were inadvertently omitted by the Patent Office:

--Hokari et al., "Characteristics of MOSFET Prepared on Si/MgO.$Al_2O_3$/$SiO_2$/Si Structure", IEEE Transactions on Electron Devices, Vol. ED-32, No. 2, February 1985, pps. 253-257.--.

UNITED STATES PATENT AND TRADEMARK OFFICE
CERTIFICATE OF CORRECTION

PATENT NO. : 5,037,774

DATED : August 6, 1991

INVENTOR(S) : Hideki Yamawaki et al

It is certified that error appears in the above-identified patent and that said Letters Patent is hereby corrected as shown below:

In the Drawings

The following drawings are not legible or have been completely omitted by the Patent Office. Therefor, the following Drawing Sheets should read as shown on the attached pages.

Figure 9A:
FIGS. 9a and 9b are photo-micrographs ($\times 400$) of the single-crystalline Si layer according to this invention and the prior art, respectively.
Figure 9B:
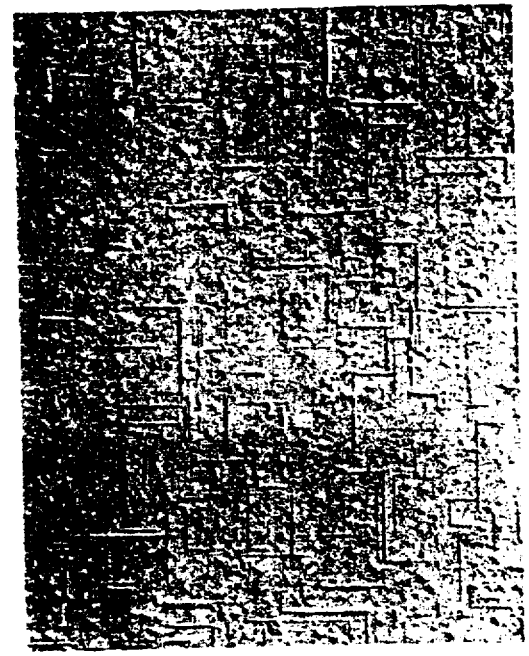
Figure 13A:
FIGS. 13a and 13b are photo-micrographs ($\times 400$) of the single-crystalline Si layers with two Si buffer layers and with a single Si buffer layer according to this invention, respectively.
Figure 13B:
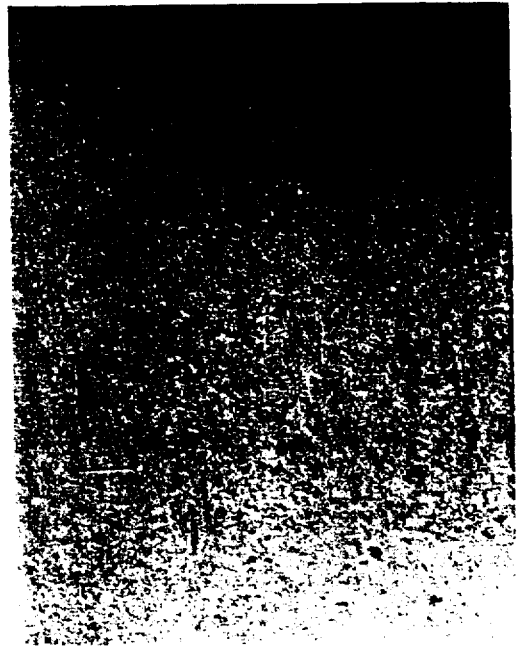
Figure 15A:
FIGS. 15a and 15b are micro-photographs ($\times 100$) of the single-crystalline Si layers with and without the slowly grown Si layer according to this invention, respectively.
Figure 15B:
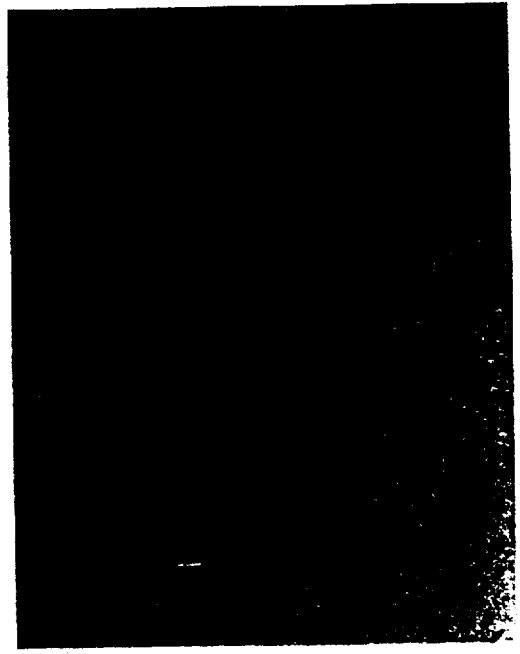

```
--Sheet  3 of 12, FIGS.  6a and  6b
  Sheet  4 of 12, FIGS.  7a and  7b
  Sheet  5 of 12, FIGS.  8a and  8b
  Sheet  6 of 12, FIGS.  9a and  9b
  Sheet  7 of 12, FIGS. 10a and 10b
  Sheet 10 of 12, FIGS. 13a and 13b
  Sheet 11 of 12, FIGS. 15a and 15b--.
```

Col. 4, line 11, "1 1" should be --1 $\ell$--;
line 54, "thickness additional" should be --thickness of the additional--.

Col. 6, line 61, "4a and 4b)." should be --(see Figs. 4a and 4b).--.

*Fig. 10a*        *Fig. 10b*
 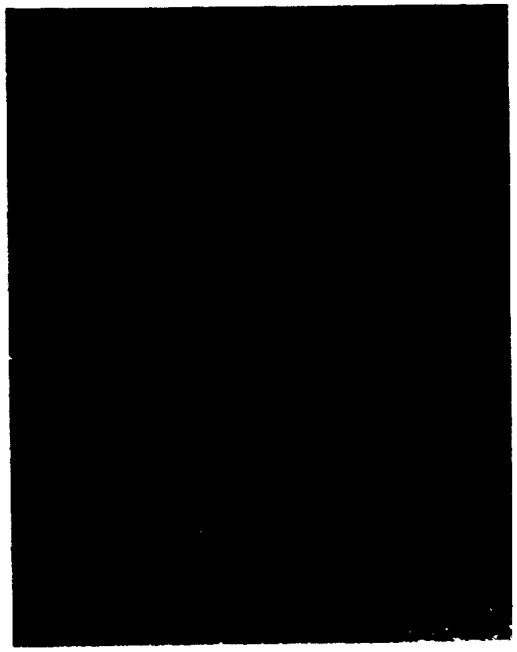

UNITED STATES PATENT AND TRADEMARK OFFICE
CERTIFICATE OF CORRECTION

PATENT NO. : 5,037,774
DATED : AUGUST 6, 1991
INVENTOR(S) : HIDEKI YAMAWAKI ET AL.

It is certified that error appears in the above-identified patent and that said Letters Patent is hereby corrected as shown below:

```
Col.  7,  line 20,  "follow." should be --follows.--;
          line 26,  "1 1"     should be --1 ℓ--.

Col.  8,  line  9,  "1 1"     should be --1 ℓ--.

Col.  9,  line  2,  "1 1"     should be --1 ℓ--.

Col. 10,  line 27,  "1 1"     should be --1 ℓ--;
          line 65,  "1 1"     should be --1 ℓ--.
```

Signed and Sealed this

Thirteenth Day of April, 1993

Attest:

STEPHEN G. KUNIN

*Attesting Officer*     *Acting Commissioner of Patents and Trademarks*